United States Patent
Cripe

(10) Patent No.: US 9,461,236 B1
(45) Date of Patent: Oct. 4, 2016

(54) SELF-NEUTRALIZED PIEZOELECTRIC TRANSISTOR

(71) Applicant: David W. Cripe, Mount Vernon, IA (US)

(72) Inventor: David W. Cripe, Mount Vernon, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 14/719,637

(22) Filed: May 22, 2015

(51) Int. Cl.
| | |
|---|---|
| H01L 29/84 | (2006.01) |
| H01L 41/107 | (2006.01) |
| H01L 41/083 | (2006.01) |
| H01L 41/047 | (2006.01) |
| H01L 41/25 | (2013.01) |
| H01L 41/297 | (2013.01) |

(52) U.S. Cl.
CPC ......... *H01L 41/107* (2013.01); *H01L 41/0471* (2013.01); *H01L 41/083* (2013.01); *H01L 41/25* (2013.01); *H01L 41/297* (2013.01)

(58) Field of Classification Search
CPC .................................................... H01L 49/00
USPC ........................................................ 257/254
See application file for complete search history.

(56) References Cited

U.S. PATENT DOCUMENTS

| | | | | |
|---|---|---|---|---|
| 2004/0080242 | A1* | 4/2004 | Ohnishi | F02D 41/2096 310/314 |
| 2009/0179523 | A1* | 7/2009 | Wang | B82Y 10/00 310/338 |
| 2010/0328984 | A1* | 12/2010 | Elmegreen | G11C 11/412 365/72 |
| 2011/0049579 | A1* | 3/2011 | Dumitru | B82Y 10/00 257/254 |
| 2011/0133603 | A1* | 6/2011 | Elmegreen | H01L 49/00 310/328 |
| 2013/0009668 | A1* | 1/2013 | Elmegreen | H01L 49/00 326/102 |
| 2014/0167571 | A1* | 6/2014 | Meyer | H01L 41/107 310/366 |
| 2014/0169078 | A1* | 6/2014 | Elmegreen | G11C 11/22 365/157 |
| 2015/0255699 | A1* | 9/2015 | Elmegreen | H01L 49/00 310/366 |

OTHER PUBLICATIONS

Schmitt trigger, from Wikipedia, the free encyclopedia, found online at https://en.wikipedia.org/wiki/Schmitt_trigger, May 20, 2015, 11 pages.

* cited by examiner

*Primary Examiner* — Matthew Landau
*Assistant Examiner* — Igwe U Anya
(74) *Attorney, Agent, or Firm* — Angel N. Gerdzhikov; Donna P. Suchy; Daniel M. Barbieri

(57) ABSTRACT

A piezoelectric transistor includes an input terminal, a piezoresistive element, an output terminal, an insulator, a control terminal, and a piezoelectric actuator. The piezoresistive element is electrically positioned between the input terminal and the output terminal. The insulator is positioned between the piezoresistive element and the piezoelectric actuator. The insulator electrically insulates the output terminal from the control terminal. The control terminal is configured to control activation of a piezoelectric actuator.

21 Claims, 2 Drawing Sheets

SELF-NEUTRALIZED PIEZOELECTRIC TRANSISTOR

BACKGROUND

Three terminal active devices, such as bipolar junction transistors (BJTs), field-effect transistors (FETs), metal-oxide-semiconductor field-effect transistors (MOSFETs), heterojunction bipolar transistors (HBTs), and high-electron-mobility transistors (HEMTs), operate with the common feature that the voltage gain of the device has a negative sign. That is, an increase in voltage on the control terminal results in a decreasing voltage in the output terminal. For a device with voltage gain having a negative sign at the output terminal, the voltage gain having a negative sign causes the device's Miller capacitance occurring between the gate and drain (or base and collector, etc.) to be amplified. This amplification of the device's Miller capacitance contributes to the frequency related roll-off of device gain.

Miller capacitance generically refers to the parasitic capacitance between the output terminal and control terminal of an active electronic device. Specifically, it refers to the capacitance between base and collector in a BJT, grid and plate in a vacuum tube, and drain and gate in a JFET, MOSFET or HEMT. Miller capacitance is intrinsic to the device, and is a function of the device's geometry, composition, and instantaneous operating voltage.

When an active electronic device is configured as a voltage amplifier, which operates with a grounded emitter, a cathode, or a source, the active electronic device typically exhibits voltage gain with magnitude greater than one but with a negative sign. Consequently, the parasitic Miller capacitance between control node and output acts as a negative feedback element. If the voltage on the control terminal of the active device rises, the output voltage falls and results in current flow within this Miller capacitance. This effect is amplified by the voltage amplification of the device. The current within the Miller capacitance results in a decreasing gain of the device at higher frequencies due to the increasing current diverted from the control terminal into the Miller capacitance. This current is superimposed onto the gate current required to charge and discharge the gate-source capacitance.

Efforts to design amplifier devices with improved high-frequency performance have generally involved means to reduce Miller capacitance. For example, for a a pentode or tetrode vacuum tube, a shielding screen can be interposed between the plate and control grid of the vacuum tube to block most of the effects of the plate voltage from the grid. Cascode amplifiers behave analogously in solid-state devices.

All currently known active devices possess voltage gain with negative sign and exhibit Miller capacitance.

A recently developed alternative active device is the Piezoelectric Transistor (PET). A PET includes a piezoelectric actuator (sometimes referred to as a piezoelectric transducer) coupled to a piezoresistive element (e.g., piezoresistive switch) to create an electromagnetic analogue to a conventional transistor.

SUMMARY

In one aspect, embodiments of the inventive concepts disclosed herein are directed to a piezoelectric transistor including an input terminal, a piezoresistive element, an output terminal, an insulator, a control terminal, and a piezoelectric actuator. The piezoresistive element is electrically positioned between the input terminal and the output terminal. The insulator is positioned between the piezoresistive element and the piezoelectric actuator. The insulator electrically insulates the output terminal from the control terminal. The control terminal is configured to control activation of a piezoelectric actuator.

In another aspect, embodiments of the inventive concepts disclosed herein are directed to a system including at least one piezoelectric transistor.

In a further aspect, embodiments of the inventive concepts disclosed herein are directed to a method for manufacturing a piezoelectric transistor.

Additional embodiments are described in the application including the claims. It is to be understood that both the foregoing general description and the following detailed description are exemplary and explanatory only and are not restrictive. Other embodiments will become apparent.

BRIEF DESCRIPTION OF THE FIGURES

Other embodiments will become apparent by reference to the accompanying figures in which.

DETAILED DESCRIPTION

Reference will now be made in detail to exemplary embodiments of the inventive concepts disclosed herein, which are illustrated in the accompanying drawings. The scope of the disclosure is limited only by the claims; numerous alternatives, modifications, and equivalents are encompassed. For the purpose of clarity, technical material that is known in the technical fields related to the embodiments has not been described in detail to avoid unnecessarily obscuring the description.

Figure 1:
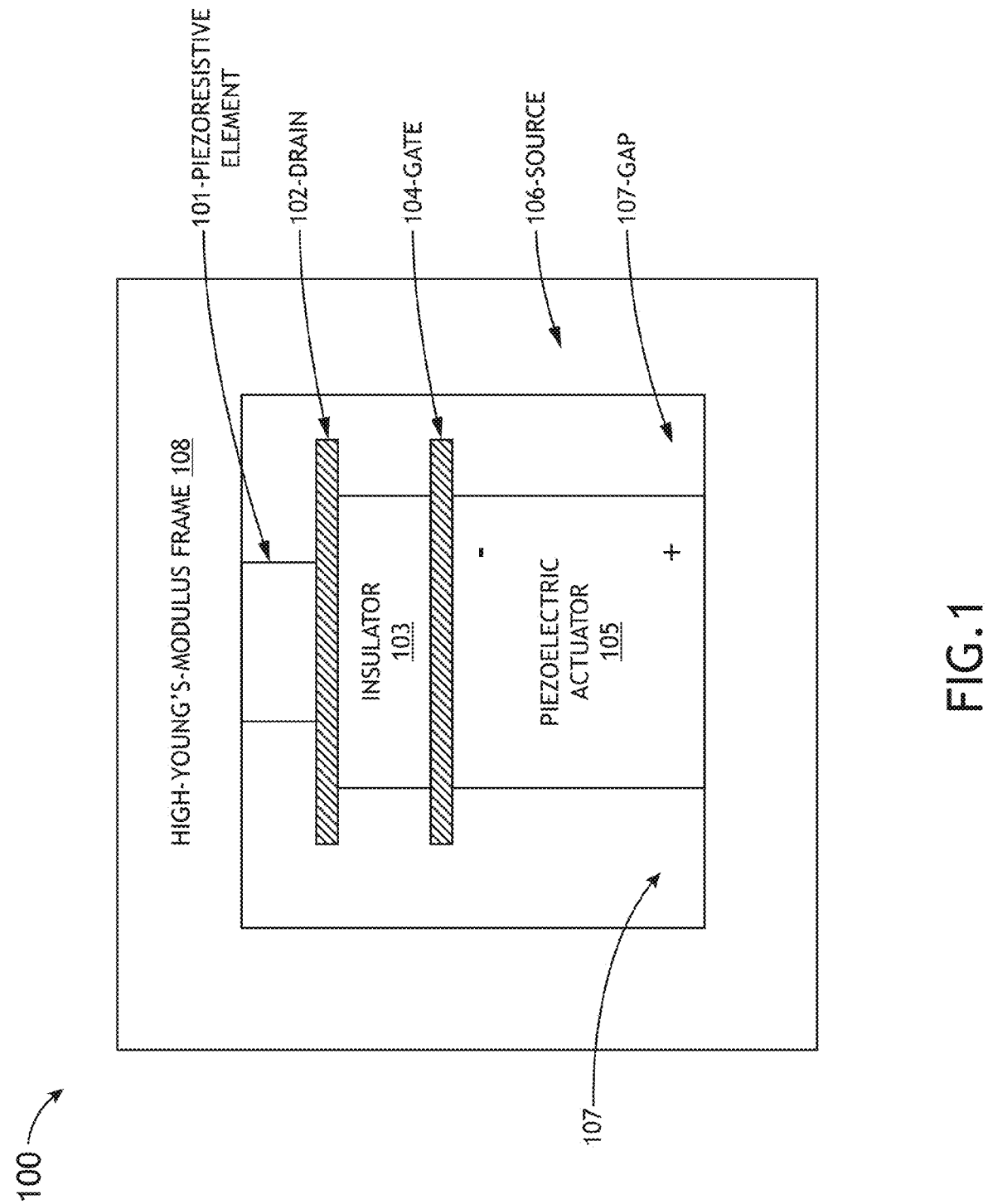
FIG. 1 shows a cross-sectional diagram of a PET of one embodiment.

Referring now to FIG. 1, a view of a piezoelectric transistor (PET) 100 of one embodiment is shown. The PET 100 may be implemented as a self-neutralized PET or as a non-self-neutralized PET, such as a Schmitt trigger. The PET 100 may include a piezoresistive element 101, an output terminal (e.g., a drain 102), an insulator 103, a control terminal (e.g., a gate 104), a piezoelectric actuator 105, an output terminal (e.g., a source 106), and a frame 108, as well as other components typically found in or utilized with PETs.

The piezoresistive element 101 may be positioned between a first internal portion of the frame 108 and the drain 102. The drain 102 may be positioned between the piezoresistive element 101 and the insulator 103. The insulator 103 may be positioned between the drain 102 and the gate 104. The gate 104 may be positioned between the insulator 103 and the piezoelectric actuator 105. The piezoelectric actuator 105 may be positioned between a second internal portion of the frame 108 and the gate 103. In effect, the piezoelectric actuator 105 may be mechanically coupled via the insulator 103 to the piezoresistive element 101. The piezoresistive element 101, the drain 102, the insulator 103, the gate 104, and the piezoelectric actuator 105 may comprise a stack within the frame 108.

The piezoresistive element 101 may be implemented as a piezoresistive layer that acts as a piezoresistive switch. The piezoresistive element 101 may be composed of any suitable piezoresistive material, such as samarium telluride (SmTe), samarium selenide (SmSe), thulium telluride (TmTe), nickel disulfide/diselenide (Ni(SxSe1-x)$_2$), calcium ruthenium oxide (Ca$_2$RuO$_4$), a combination thereof, or the like. The piezoresistive element 101 undergoes an insulator-to-metal (e.g., insulator-to-conductor) transition when under an amount of pressure (e.g., an amount of pressure caused by an expansion of the piezoelectric actuator 105). A surface area of the piezoresistive element 101 that is positioned against the frame 108 and/or the drain 102 may be less than cross-sectional surface areas of the insulator 103 and/or the piezoelectric actuator 105.

The insulator 103 may be implemented as an insulating layer that acts as a dielectric between the gate 104 and the drain 102. The insulator 103 may be composed of any suitable insulating material, such as silicon dioxide (SiO$_2$), silicon nitride (Si$_3$N$_4$), a combination thereof, or the like. The insulator 103 may have any suitable dimensions (e.g., thickness), mechanical properties (e.g., Young's modulus), and electrical properties (e.g., resistivity or dielectric constant). In one embodiment where the PET 100 is a self-neutralized PET, the insulator 103 has suitable dimensions, electrical properties, and mechanical properties such that the insulator 103 at least substantially neutralizes (e.g., offsets) the Miller capacitance between the gate 104 and the drain 102. In another embodiment where the PET 100 is implemented as a Schmitt trigger, the insulator 103 has suitable dimensions, electrical properties, and mechanical properties such that the insulator 103 undercompensates or overcompensates for the Miller capacitance between the gate 104 and the drain 102.

The piezoelectric actuator 105 may be implemented as a piezoelectric layer. The piezoelectric actuator 105 may be composed of any suitable piezoelectric material, such as lead zirconate titanate (PZT), lead magnesium niobate-lead titanate (PMN-PT), lead zinc niobate-lead titanate (PZN-PT), piezoelectric materials made from perovskite titanates, a combination thereof, or the like. Because the piezoelectric actuator is positioned between the gate 104 and the source 106, the piezoelectric actuator 105 expands when a voltage is applied (e.g., increased) to the gate 104 and, likewise, contracts when the voltage is reduced or ceased. An expansion of the piezoelectric actuator 105 compresses the piezoresistive element 101, which induces an insulator-to-metal transition upon reaching a threshold pressure. Similarly, a contraction of the piezoelectric actuator 105 relaxes compression of the piezoresistive element 101, which induces a metal-to-insulator transition upon reaching a threshold pressure.

In one embodiment, charge carriers (e.g., electrons) enter the PET 100 through the source 106, and charge carriers may leave the PET 100 through the drain 102; however, it is contemplated that the charge carriers may be allowed to travel in reverse in other embodiments. The gate 104 modulates the conductivity between the source 106 and the drain 102. In one embodiment, by applying a positive control voltage (or increasing the control voltage) to the gate 104, which creates an electric field through the piezoelectric actuator 105 between the gate 104 (e.g., a first electrode) and the source 106 (e.g., a second electrode), the piezoelectric actuator 105 is activated causing the piezoelectric actuator 105 to expand. Expansion of the piezoelectric actuator 105 in turn compresses the piezoresistive element 101. Compression of the piezoresistive element 101 induces an insulator-to-metal transition of the piezoresistive element 101, thereby reducing the resistance of the piezoresistive element 101. Thus, when the piezoresistive element 101 has a reduced resistance, a current is free to pass between the source 106 and the drain 102. Likewise, by applying negative control voltage (or reducing the control voltage) to the gate 104, the piezoelectric actuator 105 contracts. Contraction of the piezoelectric actuator 105 in turn relaxes an amount of compression (or induces tension) on the piezoresistive element 101. Relaxation of the compression of the piezoresistive element 101 induces a metal-to-insulation transition of the piezoresistive element 101, thereby increasing the resistance of the piezoresistive element 101. Thus, when the piezoresistive element 101 has an increased resistance, preventing (or reducing) a current from passing between the source 106 and the drain 102.

As shown in FIG. 1, the polarity of the PET 100 is reversed in the conventional sense, in that the piezoelectric actuator 105 expands on the application of a negative voltage at the control terminal (e.g., the gate 104) causing the PET 100 to have a voltage gain with a positive sign. By selecting the insulator 103 to have appropriate dimensions (e.g., thickness), the insulator 103 may form a dielectric of the Miller capacitance. Where the insulator 103 is implemented as a dielectric of the Miller capacitance, the PET 100 may be implemented as a device having a Miller current that substantially (e.g., exactly or nearly exactly) compensates for the current required to charge the parasitic capacitance of the PET 100. Thus, where the insulator 103 is implemented as a dielectric of the Miller capacitance, the PET 100 is bandwidth constrained not by device electrical parameters, but by a mechanical resonance due to expansion and contraction of the piezoelectric actuator 105.

Gaps 107 or a soft spacer material may separate portions of the piezoresistive element 101, the drain 102, the gate 104, and the piezoelectric actuator 105 from the frame 108, which may comprise a high-yield strength material. In embodiments that utilize soft spacer material, the soft spacer material has yield strength that is less (e.g., significantly less) than the frame 108.

The frame 108, which be implemented as a high-Young's modulus material, allows a compressive force to be transferred to the piezoresistive element 101 when the piezoelectric actuator 105 expands. The frame may be composed of any suitable high-yield strength material, such as silicon dioxide (SiO$_2$), aluminum nitride (AlN), a combination thereof, or the like. The frame 108 may be positioned around the piezoresistive element 101, the drain 102, the insulator 103, the gate 104, the piezoelectric actuator 105, and the gaps 107 (or other soft spacer material) such that an an expansion of the piezoelectric actuator 105 is mechanically transferred as a compressive force to the piezoresistive element 101 (e.g., via the insulator 103) within the frame 108. The frame 108 may include or be electrically coupled to the source 106.

As the piezoresistive element 101 (e.g., a piezoresistive switch) is electrically isolated from the piezoelectric actuator 105, the piezoresistive element 101 may be configured as either a pull-up or a pull-down device. Similarly, the gate 104 that controls the piezoelectric actuator 105 may be connected so that either a positive or negative going control signal actuates the piezoelectric actuator 105, which causes a resistivity of the piezoresistive element 101 to change. Thus, the PET 100 may be configured to possess gain with either positive or negative sign.

In one embodiment, for a PET 100 configured with positive signed voltage gain, an increasing control voltage results in an increasing output voltage. Miller capacitance (e.g., parasitic capacitance) between a control terminal (e.g., gate 104) and an output terminal (e.g., drain 102) will be charged with a current that is of opposite sign as that of current entering the capacitance of the piezoelectric actuator 105, permitting any degree of positive or negative feedback between output and input to be controlled.

Unlike either a vacuum tube or semiconductor device, an equivalent Miller capacitance of a PET 100 may be customized by modifying the physical structure of the PET 100, such as by modifying the structure of the insulator 103. A dielectric separation between the control terminal (e.g., the gate 104) of the piezoelectric actuator 105 and the piezoresistive element 101 output terminal (e.g., the drain 102) forms the Miller capacitance. The relationship of surface area, thickness and dielectric constant of the insulator 103 (e.g., a dielectric) may be varied during fabrication to create any suitable Miller capacitance as desired. In one embodiment, the insulator 103 may have suitable dimensions, electrical properties, and mechanical properties such that the insulator 103 at least substantially neutralizes (e.g., offsets) the Miller capacitance between the control terminal (e.g., the gate 104) and the output terminal (e.g., the drain 102). Such a self-neutralizing PET would be desirable for use in radio frequency (RF) power amplifiers to negate degradation in power amplifier frequency response due to the Miller capacitance.

In another embodiment where the PET 100 is implemented as a Schmitt trigger, the insulator 103 has suitable dimensions, electrical properties, and mechanical properties such that the insulator 103 undercompensates or overcompensates for the Miller capacitance between the control terminal (e.g., the gate 104) and the output terminal (e.g., the drain 102). For example, such overcompensation for the Miller capacitance may produce a positive feedback effect that is analogous to that of hysteresis of a Schmitt Trigger logic gate, in which a slowly varying input signal will result in an abrupt change in output signal when the input passes a certain threshold. Such a hysteretic effect is introduced due to the positive feedback.

As shown in FIG. 1, the PET 100 is a three-terminal PET with three terminals being a drain terminal (corresponding to the drain 102), a gate terminal (corresponding to the gate 104), and a source terminal (corresponding to the source 106). Other embodiments may include a PET having more than three terminals; for example, a similarly configured four-terminal PET may include a drain terminal, a gate terminal, a source terminal, and a body terminal (sometimes referred to as a bulk or substrate) which may, for example, be connected to the source terminal.

In some embodiments, a system or device may include at least one PET 100. For example, a computer system may include one or more components that includes at least one PET 100. Further, for example, an integrated circuit (e.g., a radio frequency integrated circuit (RFIC), such as a transmit/receive RFIC) may include at least one PET 100. Additionally, for example, an electronically scanned array (ESA) (such as an active ESA (AESA)) antenna system may include at least one power amplifier, where some or all of the power amplifiers include at least one self-neutralized PET.

Figure 2:
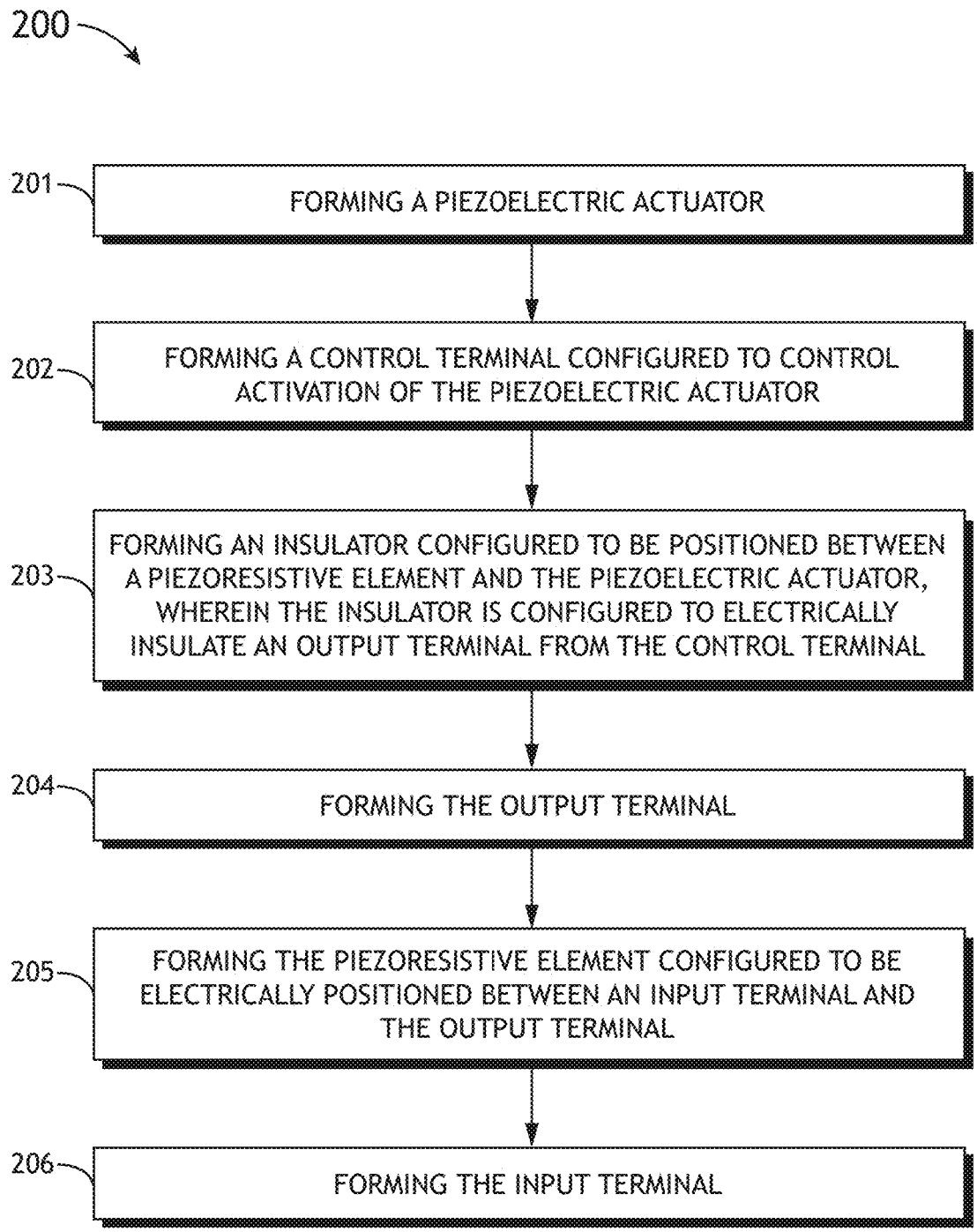
FIG. 2 shows a method of manufacturing a PET of one embodiment.

Referring now to FIG. 2, a method 200 of manufacturing (e.g., fabricating) a PET 100 of one embodiment is shown. For example, the method 200 may include a step 201 of forming a piezoelectric actuator. The method 200 may also include a step 202 of forming a control terminal configured to control activation of the piezoelectric actuator. The method 200 may additionally include a step 203 of forming an insulator configured to be positioned between a piezoresistive element and the piezoelectric actuator, wherein the insulator is configured to electrically insulate an output terminal from the control terminal. The method 200 may further include a step 204 of forming the output terminal.

The method 200 may also include a step 205 of forming the piezoresistive element configured to be electrically positioned between an input terminal and the output terminal. The method 200 may further include a step 206 of forming the input terminal. As described herein, "forming" may include placing, depositing, lithographically processing, etching, layering, heating, poling, planarizing, positioning, attaching, gluing, welding, soldering, securing, mounting, and/or the like, such as through the use of computer controlled equipment (such as semiconductor fabrication devices, assembly line equipment, or the like) configured to "form" various components, or the like. Further, the method 200 may include forming any of various components disclosed throughout.

As used throughout, "at least one" means one or a plurality of; for example, "at least one" may comprise one, two, three, . . . , one hundred, or more. Similarly, as used throughout, "one or more" means one or a plurality of; for example, "one or more" may comprise one, two, three, . . . , one hundred, or more.

In the present disclosure, it is understood that the specific order or hierarchy of steps in the methods, operations, and/or functionality disclosed are examples of exemplary approaches. Based upon design preferences, it is understood that the specific order or hierarchy of steps in the methods, operations, and/or functionality can be rearranged while remaining within the disclosed subject matter. The accompanying claims may present elements of the various steps in a sample order, and are not necessarily meant to be limited to the specific order or hierarchy presented.

It is believed that embodiments of the present disclosure and many of its attendant advantages will be understood by the foregoing description, and it will be apparent that various changes can be made in the form, construction, and arrangement of the components thereof without departing from the scope of the disclosure or without sacrificing all of its material advantages. The form herein before described being merely an explanatory embodiment thereof, it is the intention of the following claims to encompass and include such changes.

What is claimed is:

1. A piezoelectric transistor, comprising:
   an input terminal;
   an output terminal;
   a piezoresistive element electrically positioned between the input terminal and the output terminal;
   a piezoelectric actuator;
   a control terminal configured to control activation of the piezoelectric actuator; and
   an insulator positioned between the piezoresistive element and the piezoelectric actuator so as to electrically insulate the output terminal from the control terminal, wherein the piezoelectric transistor is a self-neutralized piezoelectric transistor.

2. The piezoelectric transistor of claim 1, wherein the input terminal is a source, the output terminal is a drain, and the control terminal is a gate.

3. The piezoelectric transistor of claim 2, further comprising a frame having a first internal portion and a second internal portion, and wherein the piezoresistive element is positioned between the first internal portion of the frame and the drain, the drain is positioned between the piezoresistive element and the insulator, the insulator is positioned between the drain and the gate, the gate is positioned between the insulator and the piezoelectric actuator, and the piezoelectric actuator is positioned between the second internal portion of the frame and the gate.

4. The piezoelectric transistor of claim 1, wherein an activation of the piezoelectric actuator by a control voltage applied to the control terminal causes an expansion or a contraction of the piezoelectric actuator that transfers a force to the piezoresistive element.

5. The piezoelectric transistor of claim 4, wherein a transfer of the force to the piezoresistive element changes a resistivity of the piezoresistive element.

6. The piezoelectric transistor of claim 5, wherein a change in the resistivity of the piezoresistive element changes conductivity in a path from the input terminal to the output terminal.

7. The piezoelectric transistor of claim 1, wherein the insulator at least substantially neutralizes a Miller capacitance between the output terminal and the control terminal.

8. The piezoelectric transistor of claim 1, wherein the insulator neutralizes a Miller capacitance between the output terminal and the control terminal.

9. The piezoelectric transistor of claim 1, wherein the piezoelectric transistor is bandwidth constrained by a mechanical resonance due to expansion and contraction of the piezoelectric actuator.

10. The piezoelectric transistor of claim 1, wherein an output of the piezoelectric transistor has a voltage gain with a positive sign.

11. The piezoelectric transistor of claim 1, wherein an output of the piezoelectric transistor has a voltage gain with a negative sign.

12. The piezoelectric transistor of claim 1, wherein the piezoelectric transistor is a three-terminal transistor.

13. The piezoelectric transistor of claim 1, wherein the piezoelectric transistor has at least four terminals.

14. The piezoelectric transistor of claim 1, wherein the insulator is implemented as a dielectric.

15. A system, comprising:
at least one self-neutralized piezoelectric transistor comprising:
an input terminal;
an output terminal;
a piezoresistive element electrically positioned between the input terminal and the output terminal;
a piezoelectric actuator;
a control terminal configured to control activation of the piezoelectric actuator; and
an insulator positioned between the piezoresistive element and the piezoelectric actuator so as to electrically insulate the output terminal from the control terminal.

16. A method for manufacturing a piezoelectric transistor, comprising:
forming a piezoelectric actuator;
forming a control terminal configured to control activation of the piezoelectric actuator;
forming an insulator configured to be positioned between a piezoresistive element and the piezoelectric actuator, wherein the insulator is configured to electrically insulate an output terminal from the control terminal;
forming the output terminal;
forming the piezoresistive element configured to be electrically positioned between an input terminal and the output terminal; and
forming the input terminal,
wherein the piezoelectric transistor is a self-neutralized piezoelectric transistor.

17. A piezoelectric transistor, comprising:
an input terminal;
an output terminal;
a piezoresistive element electrically positioned between the input terminal and the output terminal;
a piezoelectric actuator;
a control terminal configured to control activation of the piezoelectric actuator; and
an insulator positioned between the piezoresistive element and the piezoelectric actuator so as to electrically insulate the output terminal from the control terminal, wherein the insulator overcompensates for a Miller capacitance between the control terminal and the output terminal.

18. The piezoelectric transistor of claim 17, wherein the piezoelectric transistor is implemented as a Schmitt trigger.

19. The piezoelectric transistor of claim 17, wherein an overcompensation for the Miller capacitance produces a positive feedback effect with hysteresis.

20. A system, comprising:
at least one piezoelectric transistor comprising:
an input terminal;
an output terminal;
a piezoresistive element electrically positioned between the input terminal and the output terminal;
a piezoelectric actuator;
a control terminal configured to control activation of the piezoelectric actuator; and
an insulator positioned between the piezoresistive element and the piezoelectric actuator so as to electrically insulate the output terminal from the control terminal, wherein the insulator overcompensates for a Miller capacitance between the control terminal and the output terminal.

21. A method for manufacturing a piezoelectric transistor, comprising:
forming a piezoelectric actuator;
forming a control terminal configured to control activation of the piezoelectric actuator;
forming an insulator configured to be positioned between a piezoresistive element and the piezoelectric actuator, wherein the insulator is configured to electrically insulate an output terminal from the control terminal, wherein the insulator is configured to overcompensate for a Miller capacitance between the control terminal and the output terminal;
forming the output terminal;
forming the piezoresistive element configured to be electrically positioned between an input terminal and the output terminal; and
forming the input terminal.

* * * * *